(12) United States Patent
Nakamura et al.

(10) Patent No.: US 7,695,638 B2
(45) Date of Patent: Apr. 13, 2010

(54) REGENERATION PROCESS OF ALKALINE PERMANGANATE ETCHING SOLUTION AND UNIT THEREFOR

(75) Inventors: Norikazu Nakamura, Nagano (JP); Masao Nakazawa, Nagano (JP); Hidekazu Miyamoto, Nagano (JP); Kenji Miyazawa, Nagano (JP); Manabu Saito, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 155 days.

(21) Appl. No.: 11/739,332

(22) Filed: Apr. 24, 2007

(65) Prior Publication Data

US 2008/0124258 A1    May 29, 2008

(30) Foreign Application Priority Data

Nov. 24, 2006    (JP) .............................. 2006-316829

(51) Int. Cl.
   *C23F 1/02*    (2006.01)
(52) U.S. Cl. ............................ 252/79.1; 216/93; 423/50
(58) Field of Classification Search .................. 423/50; 252/79.1; 216/93
   See application file for complete search history.

(56) References Cited

U.S. PATENT DOCUMENTS

| | | | | |
|---|---|---|---|---|
| 4,911,802 | A * | 3/1990 | D'Ambrisi | 205/475 |
| 2002/0142619 | A1 * | 10/2002 | Grabbe et al. | 438/753 |
| 2003/0141198 | A1 * | 7/2003 | De Boer et al. | 205/475 |
| 2005/0274677 | A1 * | 12/2005 | Isaac | 210/702 |

FOREIGN PATENT DOCUMENTS

| | | |
|---|---|---|
| JP | 6-6033 | 1/1994 |
| JP | 2000-13000 | 1/2000 |
| JP | 2001-156428 | 6/2001 |

* cited by examiner

*Primary Examiner*—Stuart Hendrickson
*Assistant Examiner*—Michelle Hou
(74) *Attorney, Agent, or Firm*—Rankin, Hill & Clark LLP

(57) ABSTRACT

In a reaction chamber (20), a used alkaline permanganate etching solution (12) is accommodated and an alkaline earth hydroxide (14) such as calcium hydroxide is added in the reaction chamber, a liquid inside of the reaction chamber is agitated, the liquid is exhausted from a side portion or a top portion of the reaction chamber through a filter (28), a precipitate (26) adhered to the filter is scraped off, and a precipitate containing a hardly soluble or insoluble matter incapable of passing through the filter and accumulated on a bottom portion of the reaction chamber is exhausted from the reaction chamber.

5 Claims, 2 Drawing Sheets

REGENERATION PROCESS OF ALKALINE PERMANGANATE ETCHING SOLUTION AND UNIT THEREFOR

BACKGROUND OF THE INVENTION

The invention relates to a regeneration and life-prolonging process of an etching solution that uses an alkaline permanganate etching solution or a waste liquid thereof and a unit therefor, in particular, a process of applying a batch process to an alkaline permanganate solution or a waste liquid thereof to regenerate and prolong a lifetime and a unit therefor. Furthermore, the invention relates to a regeneration process of an alkaline permanganate etching solution that uses an alkaline earth hydroxide such as calcium hydroxide and simultaneously relates to a process that generates and uses an alkaline metal compound such as sodium hydroxide necessary for an alkaline permanganate solution.

So far, an alkaline permanganate etching solution has been applied to an etching process of a resin such as a desmear process or a roughening process of a wiring board. In general, when a throughhole disposed on a wiring board is plated to establish electrical continuity, a cutting debris such as a resin that disturbs the electrical continuity after a throughhole is formed remains. The desmear process is a process by which decomposes a resin component in an alkaline permanganate etching solution. Furthermore, the roughening process is a process by which a surface of a resinous insulating layer is roughened with an alkaline permanganate etching solution.

Recently, an additive process where a resin is coated on a surface of an inner layer board, the resin is directly plated, and a pattern etching is applied thereto to prepare a wiring board is being adopted. In the additive process, in order to improve the adhesiveness between the resinous insulating layer and the plating, before applying a plating process, a surface of an insulating layer is roughened. In an etching process of a resin, which uses an alkaline permanganate etching solution, in the alkaline permanganate etching solution, carbon (C) of a resin component and a hydroxyl group (OH⁻) in the alkaline solution react with permanganic acid as shown by an equation (1) below to decompose the resin component.

[Formula 1]

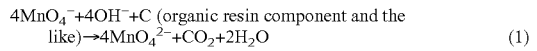

$$4MnO_4^- + 4OH^- + C \text{ (organic resin component and the like)} \rightarrow 4MnO_4^{2-} + CO_2 + 2H_2O \quad (1)$$

However, in the existing technology mentioned above, when the alkaline permanganate etching solution is kept on using, carbon dioxide ($CO_2$) generated from carbon (C) in the resin and carbon dioxide present in air are taken in the liquid to react as shown by an equation (2) to increase carbonate ions in the liquid.

[Formula 2]

$$CO_2 + 2OH^- \rightarrow CO_3^{2-} + H_2O \quad (2)$$

As the result, carbonate ions are accumulated in the etching solution. On the other hand, a concentration of hydroxyl groups (OH⁻) necessary for etching is lowered. When the carbonate ions are accumulated in the etching solution, the lifetime of the etching solution becomes shorter. Furthermore, when the hydroxyl group ions in the etching solution are lowered, the etching capability is lowered. Still furthermore, the alkalinity of the etching solution is managed by the neutralization titration. However, since, in the neutralization titration, not only the hydroxyl group ions but also carbonate ions ($CO_3^{2-}$) are neutralized, accurate alkalinity cannot be analyzed to deteriorate the accuracy in the liquid analysis.

Thus, when a carbonate ion concentration in the alkaline permanganate etching solution increases, there is caused a problem in that the etching efficiency is deteriorated and an accurate hydroxyl group concentration can be analyzed with difficulty.

In the etching process that uses an alkaline permanganate etching solution, as the background arts relating to regeneration of the etching solution, what follows can be cited.

In patent literature 1 (JP-A No. 06-6033), a process where the stability of an etching bath can be maintained, etching defects are inhibited from occurring and a constant etching speed can be maintained is proposed. According to the proposal, a predetermined amount of an etching solution is sampled at a predetermined time interval from the etching bath, concentrations of permanganate, sodium hydroxide and manganate are analyzed by use of an automatic analyzer, the analysis values are calculated by a controller, and a replenishment amount for controlling the sodium hydroxide concentration to a predetermined concentration is transferred to a quantitative pump of sodium hydroxide. Furthermore, a predetermined amount of the etching solution is sampled at a constant time interval in an etching rate measuring cell, an organic solvent in the same system as that of a processed matter is kept on dripping by a circulating pump until the solution color of a calorimeter changes from red purple to green, and thereby the etching rate in the etching bath is managed while sustaining the concentration of the permanganate in the etching solution within a constant range.

Patent literature 2 (JP-A No. 2000-13000) relates to an etching process of a resin indispensable for a high-density print circuit board. In the etching process, when, in order to precipitate with a particular treatment solution carbonate ions accumulated as a reaction product in a solution and remove to stabilize the etching solution and prolong a lifetime thereof, when an alkaline permanganate solution in an etching bath is circulated by a pump, a specific solution is injected in the middle of a piping, carbonate that is a reaction product is precipitated and filtrated with a filter to remove, the alkalinity is measured with an automatic analyzer to adjust to a predetermined normality, and with the solution the resin is etched.

In patent literature 3 (JP-A No. 2001-156428), in an etching process that uses an alkaline permanganate etching solution, a method of improving the etching efficiency is proposed. According to this, in an etching bath, an alkaline permanganate etching solution is accommodated and in the etching bath an etching agent to be etched is etched. In a reaction chamber, barium chloride is added from an additive tank to react with carbonate ions to form barium carbonate that is a hardly soluble salt. Barium carbonate can be separated from an ion component by use of an ultrafilter.

[Patent literature 1] JP-A No. 06-6033

[Patent literature 2] JP-A No. 2000-13000

[Patent literature 3] JP-A No. 2001-156428

In the regeneration methods of an etching solution due To the background art literatures, patent literature 1 relates to an etching process that uses an alkaline permanganate etching solution. In the regeneration method, continuous steps such as concentration analysis, calculation with a controller and a measurement of the etching rate are necessary, that is, a complicated process is necessary to manage and process the etching solution.

Patent literature 2 is same as the patent literature 1 in a point that an alkaline permanganate etching solution is used to etch. However, the process is continuously carried out and a barium compound such as barium chloride is fundamentally used.

In patent literature 3, similarly to the above, an alkaline permanganate etching solution is used to etch. The processing is continuously carried out, an ultrafilter is used, and fundamentally barium carbonate is used.

In this connection, the invention intends to provide a regeneration process of an alkaline permanganate etching solution, which, in an etching step that uses an alkaline permanganate etching solution, in order to inhibit the etching efficiency from deteriorating, can simply and efficiently regenerate an etching solution to prolong a lifetime thereof and a unit therefor and to reduce a harmful waste solution.

SUMMARY OF THE INVENTION

In order to overcome the problems, the invention provides a process for regenerating to prolong a lifetime of an alkaline permanganate etching solution, which includes: accommodating a used alkaline permanganate etching solution in a reaction chamber and adding an alkaline earth hydroxide represented by calcium hydroxide in the reaction chamber; agitating a liquid inside of the reaction chamber; exhausting the liquid through a filter from a side portion or a top portion of the reaction chamber; and exhausting from the reaction chamber a precipitate including a hardly soluble or insoluble matter that is stocked, incapable of passing through the filter, at a bottom portion of the reaction chamber.

As an alkaline earth hydroxide added into the reaction chamber, calcium hydroxide or barium hydroxide is used.

The hardly soluble or insoluble matter adhered to the filter is partially scraped off by use of a squeegee door that combines a shielding wall of the liquid exhausting portion.

The foregoing regeneration process of an alkaline permanganate etching solution further includes: accommodating a liquid exhausted from a liquid exhausting portion of the reaction chamber in a second processing bath; precipitating a precipitate including a hardly soluble or insoluble matter contained in a liquid in the second reaction chamber; exhausting the liquid through a second filter from a side portion or a top portion of the second reaction chamber; and exhausting from the reaction chamber a precipitate including a hardly soluble or insoluble matter that is stocked, incapable of passing through the second filter, at a bottom portion of the second reaction chamber.

The hardly soluble or insoluble matter adhered to the second filter is scraped off by use of a second squeegee door that combines a shielding wall of the second liquid exhausting portion.

Furthermore, the invention provides a regeneration unit of an alkaline permanganate etching solution, which includes: a reaction chamber that receives a used alkaline permanganate etching solution and in which an alkaline earth hydroxide is added; an agitating member for agitating a liquid inside of the reaction chamber with a pump; a liquid exhausting portion that exhausts a liquid from a side portion of the reaction chamber through a filter; and a precipitate exhausting portion that exhausts from the reaction chamber a precipitate including a hardly soluble or insoluble matter that is stocked, incapable of passing through the filter, at a bottom portion of the reaction chamber.

The regeneration unit of an alkaline permanganate etching solution further includes: a second processing bath that receives a liquid exhausted from a liquid exhausting portion of the reaction chamber; a second liquid exhausting portion that exhausts a liquid from a side portion of the second reaction chamber through a second filter; and a second precipitate exhausting portion that exhausts from the reaction chamber a precipitate including a hardly soluble or insoluble matter that is stocked, incapable of passing through the second filter, at a bottom portion of the second reaction chamber.

The filter is made of a material such as stainless or tritetrafluoroethylene that is resistant to an alkaline permanganate etching solution and alkaline earth hydroxide and has a pore diameter of substantially 0.1 to 100 μm.

DETAILED DESCRIPTION OF THE PREFERRED EMBODIMENTS

Figure 1:
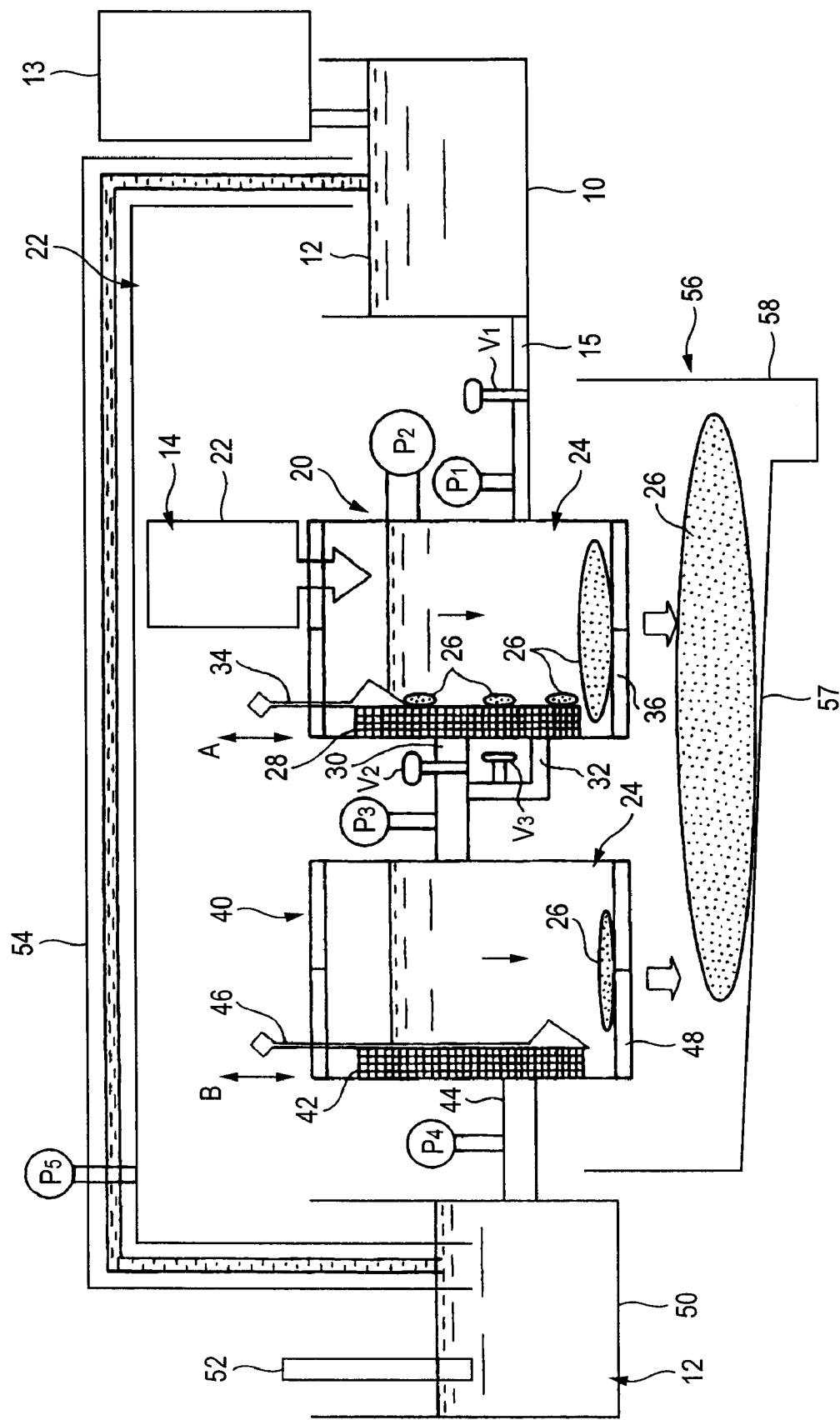
FIG. 1 is a schematic diagram showing a regeneration system of an alkaline permanganate etching solution according to the invention.

In what follows, embodiments of the invention will be detailed with reference to attached drawings. FIG. 1 is a schematic system diagram for describing a regeneration process of an alkaline permanganate etching solution according to the invention and a unit therefor.

Inside of an etching bath 10, an alkaline permanganate etching solution 12 is accommodated, and, as mentioned above, an etching process such as a desmear process or a roughening process of a resin such as the wiring board is carried out. The alkaline permanganate etching solution 12 in the etching bath 10 is analyzed of concentrations of manganese (Mn) and sodium hydroxide (NaOH) by use of an automatic analyzer 13, followed by automatically adjusting these.

In the alkaline permanganate etching solution 12 in the etching bath 10, as mentioned above, in the course of etching the resin, a concentration of carbonate ion increases to deteriorate the etching efficiency. Accordingly, after a predetermined time period, in order to regenerate the etching solution to prolong the lifetime thereof, through a pipe 15 connected to a bottom portion of the etching bath 10, the alkaline permanganate etching solution 12 is supplied to a reaction chamber 20 by use of a valve V1 and a pump P1.

The reaction chamber 20 is provided thereon with an automatic adder 22 for automatically adding alkaline earth hydroxide such as calcium hydroxide or barium hydroxide into the reaction chamber 20, and, in the embodiment, powder of calcium hydroxide 14 or an aqueous solution thereof is automatically added to used alkaline permanganate etching solution 12 in the reaction chamber 20.

A liquid 24 in the reaction chamber 20, in which powder of calcium hydroxide 14 or an aqueous solution thereof is added to the alkaline permanganate etching solution 12, is agitated with a pump P2 connected to a side portion of the reaction chamber 20. A precipitate 26 of the liquid 24 in the reaction chamber 20 sediments in the reaction chamber 20 to accumulate on a bottom portion.

On a sidewall portion or an upper portion on an exhaust side of the reaction chamber 20, exhaust ports 30 and 32 for exhausting a liquid in the reaction chamber 20 through a filter 28 are disposed in two stages up and down. The filter 28 is provided with a squeegee door 34 that combines a shielding wall of the exhaust ports 30 and 32. The squeegee door 34 can be moved up and down as shown by an arrow mark A to open the exhaust ports 30 and 32 and scrape off a precipitate 26 containing a hardly soluble or insoluble solid matter adhered to the filter 28 when the liquid 24 goes past the filter 28. The exhaust ports 30 and 32 are connected to a second reaction chamber 40 through the respective valves V2 and V3. The liquid in the reaction chamber 20 is transferred to the second reaction chamber 40 by means of a pump P3.

On a sidewall portion or an upper portion on an exhaust side of the second reaction chamber 40, an exhaust port 44 for exhausting a liquid 24 in the second reaction chamber 40 through a filter 42 is disposed. The filter 42 is provided as well with a squeegee door 46 that combines a shielding wall of the exhaust port 44. The squeegee door 46 as well can be moved up and down as shown by an arrow mark B to open the exhaust port 44 and scrape off a precipitate 26 containing a hardly soluble or insoluble solid matter adhered to the filter 42 when the liquid 24 goes past the filter 42. The exhaust port 44 is provided with a pump P4 and the pump P4 delivers the liquid 24 in the second reaction chamber 40 to an electrolysis regeneration bath 50.

The electrolysis regeneration bath 50 is provided with an electrode 52 and oxidizes hexavalent manganese to heptavalent manganese (electrolytic oxidation). A regenerated etching solution 12 (from which hardly soluble or insoluble matter such as carbonate is removed and that is electrolytically oxidized) is returned through a regenerated liquid supply path 54 to the etching bath 10 by use of a pump P5. A not shown automatic analyzer 13 is used to once more analyze and automatically adjust concentrations of manganese (Mn) and sodium hydroxide. The alkaline permanganate etching solution 12 regenerated in the etching bath 10 is used in an etching process such as a desmear process or a roughening process of a resin such as a wiring board.

At bottom portions of the reaction chamber 20 and second reaction chamber 40, doors 36 and 48 are respectively disposed for exhausting downward the precipitate 26 containing accumulated hardly soluble or insoluble solid matter. At bottom portions of the doors 36 and 48, an exhaust bath 56 of the precipitate 26 is disposed, a bottom wall 57 of the exhaust bath 56 slopes, and thereby a fallen precipitate 26 descends a sloping bottom wall 57 and exhausted from an exhaust port 58.

In the embodiment of the invention, the alkaline permanganate etching solution 12 is regenerated through a batch process. That is, the alkaline permanganate etching solution 12 in the etching bath 10, after using for a constant period, by opening the valve V1 and operating the pump P1, is supplied to the reaction chamber 20. To the alkaline permanganate etching solution 12 supplied to the reaction chamber 20, powder or an aqueous solution of calcium hydroxide 14 is added by use of an automatic added 22, followed by agitating with the pump P2. In the course of the agitating, the precipitate 26 of the liquid 24 in the reaction chamber 20 sediments in the reaction chamber 20 and accumulates on a bottom portion thereof.

After that, when the squeegee door 34 moves to an upper portion than an upper exhaust port 30 to open the upper exhaust port 30, the upper valve V2 is opened and the pump P3 is operated, the liquid 24 in the upper portion of the reaction chamber 20 is flowed through the filter 28 and the exhaust port 30 from the reaction chamber 20 to the second reaction chamber 40. The precipitate 26 containing a hardly soluble or insoluble solid matter adhered to the filter 28 is scraped off when the squeegee door 34 is moved up and down.

When the liquid in the reaction chamber 20 is exhausted to a position of the upper exhaust port 30, the squeegee door 34 is lowered to a position that clogs the upper exhaust port 30, followed by opening the lower exhaust port 32 by the squeegee door 34, further followed by closing the upper valve V2 and opening the lower valve V3. Thereby, the liquid 24 in the intermediate portion or lower portion of the reaction chamber 20 is flowed from the reaction chamber 20 through the filter 28 and the exhaust port 32 into the second reaction chamber 40. Similarly, the precipitate 26 containing a hardly soluble or insoluble solid material adhered to the filter 28 can be scraped off when the squeegee door 34 is moved up and down.

When the liquid in the reaction chamber 20 is exhausted to a position of the lower exhaust port 32, the liquid 24 remained in the neighborhood of the bottom portion of the reaction chamber 20 much contains the precipitate 26 containing hardly soluble or insoluble solid matter and becomes an waste solution. The waste solution is dropped, when the door 36 at the bottom portion of the reaction chamber 20 is opened, into the exhaust bath 56 at a lower portion, moves from the sloping wall 57 to the exhaust port 58 and is exhausted.

From the liquid 24 supplied to the second reaction chamber 40, the remaining precipitate 26 containing hardly soluble or insoluble solid matter is removed in the second reaction chamber 40. That is, the liquid 24 in the second reaction chamber 40 is left for a predetermined time period to allow the remaining precipitate 26 to precipitate. When, after a predetermined time period has elapsed, the squeegee door 42 is opened and the pump P4 is operated, the liquid 24 in the second reaction chamber 40 is supplied to an electrolysis regeneration bath 50. In the meanwhile, the squeegee door 46 is moved up and down as shown by an arrow mark B to scrape off the precipitate 26 containing a hardly soluble or insoluble solid matter adhered to the filter 42.

When the liquid 24 in the second reaction chamber 40 is exhausted to a position of the exhaust port 44, the liquid 24 remained in the neighborhood of the bottom portion of the second reaction chamber 40 becomes an waste liquid containing the precipitate 26. The waste liquid, when the door 48 at the bottom portion of the second reaction chamber 40 is opened, is dropped into the exhaust bath 56 at the lower portion, descends the sloping wall 57 and is exhausted from the exhaust port 58.

To the liquid 24 in the second reaction chamber 40 as well, powder of calcium hydroxide 14 may be once more added and other precipitant may be added once more.

Thus, in the embodiment of the invention, an waste liquid containing the precipitate that cannot pass the filters 28 and 42, that is, hardly soluble carbonate groups, is exhausted from a lower layer portion of the reaction chamber 20 or the second reaction chamber 40. The hardly soluble or insoluble matter partially adhered to the filters 28 and 42 and accumulated there is scraped off by use of the squeegee doors 34 and 46 that combine a shielding wall and dropped downward.

As described above, in a method and a unit involving the embodiment of the invention for regenerating an alkaline permanganate etching solution and prolonging the lifetime thereof, not by continuously processing, but by transferring a used etching solution to a separate processing chamber, that is, the reaction chamber 20 or the second reaction chamber 40, an operation for removing the precipitate containing carbonate groups is carried out and thereby the waste liquid is returned to a completely usable state, that is, regenerated. That is, the waste liquid is processed in batch for every unit.

Example 1

A case where a concentration of carbonate groups in an alkaline permanganate etching solution is low (a case where carbonate groups (as $Na_2CO_3$)=27.6 g/L and $Ca(OH)_2$ is added in a solution by 1 equivalent as $Na_2CO_3$) is shown as example 1.

Then, 100 ml of a permanganic acid solution of which carbonate group concentration is 27.6 g/L is sampled in a beaker, 2.190 g of calcium hydroxide (95+%) is added, followed by agitating for 1 hr at room temperature by use of a magnet agitator called as a stirrer, further followed by leaving at room temperature for 2 hr. Thereafter, a precipitate remained on a beaker bottom is suction filtered with a G4 glass filter. An weight of a separated precipitate is 68.9 g (including water) and almost all thereof is found to be carbonate as the result of FT-IR analysis (infrared absorption analysis that makes use of the Fourier transformation). The concentration of the carbonate groups in a filtrate is reduced to 8.5 g/L, pH is 13.5, a concentration of heptavalent manganese ions is 40.6 g/L, and a concentration of hexavalent manganese ions is 10.5 g/L. These values are almost same as that of a solution before the processing.

From the above, it is shown that more than 70 to 80% of carbonate groups in a deteriorated desmear permanganic acid solution could be removed by adding calcium hydroxide. A chemical reaction formula is as shown by (3) below.

[Formula 3]

$$Na_2CO_3 + Ca(OH)_2 \rightarrow CaCO_3\downarrow + 2NaOH \quad (3)$$

In what follows, results when a concentration of calcium hydroxide is varied relative to the concentration of the carbonate groups before the processing are shown in Table 1.

more, when 2 equivalent is added once, while the carbonate groups could be sufficiently reduced, the Ca concentration is such high as 15 ppm or more.

Accordingly, as the optimum process, when one-time batch process is applied with the concentration of calcium hydroxide of 1 to 1.5 equivalent, the carbonate groups can be reduced by 70 to 80%. In this case, the Ca concentration that becomes an impurity can be suppressed such slight as substantially 7 to 13 ppm.

Example 2

A case where a concentration of carbonate groups in an alkaline permanganate etching solution is high (a case where carbonate groups=118.7 g/L and 1 equivalent of $Ca(OH)_2$ is added) is shown as example 2.

Firstly, 100 ml of a permanganic acid solution of which carbonate group concentration is 118.7 g/L is sampled in a beaker, 8.793 g of calcium hydroxide (95+%) is added, followed by agitating for 1 hr by use of a stirrer at room temperature, further followed by leaving at room temperature for 2 hr. Thereafter, a precipitate remained on a beaker bottom is suction filtered with a G4 glass filter. As the result analyzed by

TABLE 1

Results of processing liquid of which carbonate group concentration is 27.6 g/L

| Before processing | Method for processing | After processing (measurements) | | | | | |
|---|---|---|---|---|---|---|---|
| Solution to be processed(measurements) | Addition amount of $Ca(OH)_2$ (equivalent to carbonate) | Precipitate (g/L) | Carbonate group (g/L) | $Mn^{+7}$ (g/L) | $Mn^{+6}$ (g/L) | Ca concentration (ppm) | pH |
| Carbonate groups 28 g/L | — | — | 27.6 | 40 | 8.3 | 0.04 | 13.3 |
| Carbonate groups 28 g/L | 0.5 equivalent (once) | 42.4 | 17.0 | 39.8 | 7.9 | 3.0 | 13.5 |
| Carbonate groups 28 g/L | 0.5 equivalent (twice) | 8.9 | 10.6 | 38.5 | 8.1 | 10.6 | 13.5 |
| Carbonate groups 28 g/L | 1 equivalent (once) | 68.9 | 8.5 | 40.6 | 10.5 | 7.4 | 13.5 |
| Carbonate groups 28 g/L | 1.5 equivalent (once) | 103.5 | 6.4 | 39.6 | 8.9 | 12.2 | 13.5 |
| Carbonate groups 28 g/L | 2 equivalent (once) | 142.7 | 4.2 | 39.7 | 7.6 | 15.4 | 13.5 |

In the case of the calcium hydroxide being used to process, when 0.5 equivalent is added twice, while the carbonate groups could be reduced by substantially 70%, the Ca concentration went up to substantially 10 ppm. On the other hand, when 1 equivalent is added once, the carbonate groups are reduced by substantially 70 to 80% and the Ca concentration could be suppressed such low as substantially 7 ppm. In the case of the carbonate concentration being low, when a batch process of 1 to 1.5 equivalent is applied, the carbonate groups could be reduced by 70 to 80% and the Ca concentration could be maintained at substantially 10 ppm or less. Furthermore, means of a method same as that of example 1, an weight of a separated precipitate is 34.8 g (including water) and almost all thereof is found to be carbonate. The concentration of the carbonate groups in a filtrate is reduced to 23.3 g/L, pH is 13.7, a concentration of heptavalent manganese ions is 65.3 g/L, and a concentration of hexavalent manganese ions is 18.7 g/L. These values are almost same as that before the processing.

In what follows, results when a concentration of calcium hydroxide is varied to the concentration of the carbonate groups before the processing are shown in Table 2.

TABLE 2

Results of processing liquid of which carbonate group concentration is 118.7 g/L

| Before processing | Method for processing Addition amount | After processing (measurements) | | | | | | | | | |
|---|---|---|---|---|---|---|---|---|---|---|---|
| Solution to be processed (measurements) | of $Ca(OH)_2$ and Times of processing | Precipitate (g/L) | | Carbonate group (g/L) | | $Mn^{+7}$ (g/L) | | $Mn^{+6}$ (g/L) | | Ca concentration (ppm) | | pH |
| Number of times of experiments | (equivalent to carbonate) | First time | Second time | First time | Second time | First time | Second time | First time | Second time | First time | Second time | First time | Second time |
| Carbonate groups 119 g/L | — | — | | 118.7 | | 69.1 | | 11.3 | | 1.4 | | 13.7 |

TABLE 2-continued

Results of processing liquid of which carbonate group concentration is 118.7 g/L

| Before processing | Method for processing Addition amount | After processing (measurements) | | | | | | | | | | | |
|---|---|---|---|---|---|---|---|---|---|---|---|---|---|
| Solution to be processed (measurements) | of Ca(OH)$_2$ and Times of processing | Precipitate (g/L) | | Carbonate group (g/L) | | Mn$^{+7}$ (g/L) | | Mn$^{+6}$ (g/L) | | Ca concentration (ppm) | | pH | |
| Number of times of experiments | (equivalent to carbonate) | First time | Second time | First time | Second time | First time | Second time | First time | Second time | First time | Second time | First time | Second time |
| Carbonate groups 119 g/L | 0.5 equivalent (once) | 256 | 195 | 25.4 | 31.8 | 71.3 | 69.5 | 12.4 | 14.8 | 7.6 | 3.00 | 13.5 | 13.7 |
| Carbonate groups 119 g/L | 0.5 equivalent (twice) | 85 | 22 | 25.4 | 33.8 | 69.4 | 67.0 | 12.3 | 14.3 | 11.6 | 15.20 | 13.7 | 13.7 |
| Carbonate groups 119 g/L | 1 equivalent (once) | 344 | 348 | 25.4 | 23.3 | 69.1 | 65.3 | 12.3 | 18.7 | 3.6 | 4.60 | 13.7 | 13.7 |
| Carbonate groups 119 g/L | 1.5 equivalent (once) | 433 | 394 | 25.4 | 21.2 | 71.4 | 69.2 | 10.7 | 14.7 | 9.2 | 5.80 | 13.7 | 13.7 |
| Carbonate groups 119 g/L | 2 equivalent (once) | 519 | 482 | 25.4 | 23.3 | 70.8 | 69.9 | 11.7 | 13.9 | 13.8 | 11.60 | 13.7 | 13.7 |

In the case of the calcium hydroxide being used to process, when 0.5 equivalent is added twice, while the carbonate groups could be reduced by substantially 70%, the Ca concentration went up to 15 ppm. Furthermore, when 1 equivalent is added once, the carbonate groups are reduced by substantially 80% and the Ca concentration could be suppressed such low as substantially 4 ppm. In the case where the carbonate concentration is high as well, at the maximum, when a 1 to 1.5 equivalent batch process is applied, the carbonate groups could be reduced by substantially 80% and the Ca concentration could be maintained at substantially 10 ppm or less.

Example 3

A case where the carbonate concentration in an alkaline permanganate etching solution is a medium extent and barium hydroxide octahydrate is used to process (carbonate group=40 g/L and 0.5 equivalent of barium hydroxide octahydrate is used twice) is shown as an example 3.

Firstly, 100 ml of a permanganic acid solution of which carbonate group concentration is 40 g/L is sampled in a beaker, 9.268 g of barium hydroxide octahydrate is added, followed by agitating for 10 min by use of a stirrer at room temperature, further followed by leaving overnight. On the following day, a precipitate remained on a beaker bottom is suction filtered with a G4 glass filter. When a separated precipitate is analyzed by use of FT-IR, it is found to be a carbonate. The concentration of the carbonate group in the filtrate is reduced to 31.8 g/L, pH in the solution is 13.5, a concentration of heptavalent manganese ions is 65.5 g/L and a concentration of hexavalent manganese ions is 5.2 g/L. These values in a permanganic acid solution of which carbonate group concentration is 40 g/L before the processing are 13.8 for the pH, 67.8 g/L for the concentration of heptavalent manganese ion and 12.2 g/L for the concentration of the hexavalent manganese ion. That is, all except for the concentration of the hexavalent manganese ion had substantially same values.

Furthermore, in 50 ml of a permanganic acid solution that is processed once, similarly, 4.634 g of barium hydroxide octahydrate is further added, followed by similarly agitating for 10 min at room temperature, further followed by leaving overnight, still further followed by suction filtering with a G4 glass filter. The pH of a filtrate is 13.6, a concentration of heptavalent manganese ion is 62.3 g/L and a concentration of hexavalent manganese ion is 4.6 g/L. These values show that although the manganese concentration is a little reduced in comparison with that of the permanganic acid solution before the processing, the pH is hardly varied. The carbonate group concentration of the filtrate is reduced to 25.4 g/L.

When barium hydroxide is used to process, a Ba concentration in the solution is 0.56 ppm for the first processing and 0.67 ppm for the second processing, namely, Ba ions are hardly dissolved in the solution. In the example 3, in the case where barium hydroxide octahydrate is used to process, a chemical reaction formula becomes as shown by (4) below.

[Formula 4]

$$Na_2CO_3 + Ba(OH)_2 \cdot 8H_2O \rightarrow BaCO_3 \downarrow + 2NaOH + 8H_2O \quad (4)$$

Example 4

A case where a carbonate group concentration in an alkaline permanganate etching solution is a medium extent and calcium hydroxide is used to process (carbonate group=40 g/L and 0.5 equivalent of calcium hydroxide is used twice) is shown as an example 4.

Firstly, 100 ml of a permanganic acid solution of which carbonate group concentration is 40 g/L is sampled in a beaker, 2.174 g of calcium hydroxide (95+%) is added, followed by agitating for 10 min by use of a stirrer at room temperature, further followed by leaving overnight. On the following day, a precipitate remained on a beaker bottom is suction filtered with a G4 glass filter. When a separated precipitate is analyzed by use of FT-IR, it is found to be a carbonate. The concentration of the carbonate group in the filtrate is reduced to 23.3 g/L, pH in the solution is 13.6, a concentration of heptavalent manganese ions is 66.3 g/L and a concentration of hexavalent manganese ions is 11.1 g/L. These values in a permanganic acid solution of which carbonate group concentration is 40 g/L before the processing are 13.8 for the pH, 67.8 g/L for the concentration of heptavalent manganese ion and 12.2 g/L for the concentration of the hexavalent manganese ion. That is, all values had substantially same values before and after the processing.

Furthermore, in 50 ml of a permanganic acid solution that is processed once, similarly, 1.104 g of calcium hydroxide is further added, followed by similarly agitating for 10 min at room temperature and leaving overnight, further followed by suction filtering with a G4 glass filter. The pH of a filtrate is 13.6, a concentration of heptavalent manganese ion is 66.9 g/L and a concentration of hexavalent manganese ion is 11.7 g/L. These values show that the manganese concentration is a little reduced in comparison with that of the permanganic acid solution before the processing but values of the pH and the like are hardly varied. The carbonate group concentration in the filtrate is reduced to 8.5 g/L.

When calcium hydroxide is used to process, a Ca concentration in the solution is 3.64 ppm for the first processing and 5.64 ppm for the second processing, namely, Ca ions are hardly dissolved in the solution.

As mentioned above, whatever waste liquid of which carbonate concentration in the etching solution is a low concentration level, a medium concentration level or a high concentration level is used, when calcium hydroxide is used to process, excellent results could be obtained.

In the case where the calcium hydroxide is used to process, when 0.5 equivalent is added twice, while the carbonate groups are reduced by substantially 70 to 80%, the Ca concentration went up to substantially 15 ppm. On the other hand, when 1 equivalent is added once, the carbonate groups are reduced by substantially 70 to 80% and the Ca concentration could be suppressed lower than two-time processing. Under the optimum conditions, when, to the concentration of the carbonate groups in the alkaline permanganate etching solution, a 1 to 1.5 equivalent calcium hydroxide is added once to process by batch, the carbonate groups can be reduced by 70 to 80% and the Ca concentration can be maintained at substantially 10 ppm or less.

It is as well found that when calcium hydroxide is used to process, the carbonate groups could be removed more effectively than the case where barium hydroxide octahydrate is used to process. Furthermore, since calcium hydroxide is cheaper in the chemical price than that of barium hydroxide octahydrate, the cost can be reduced as well.

Figure 2:
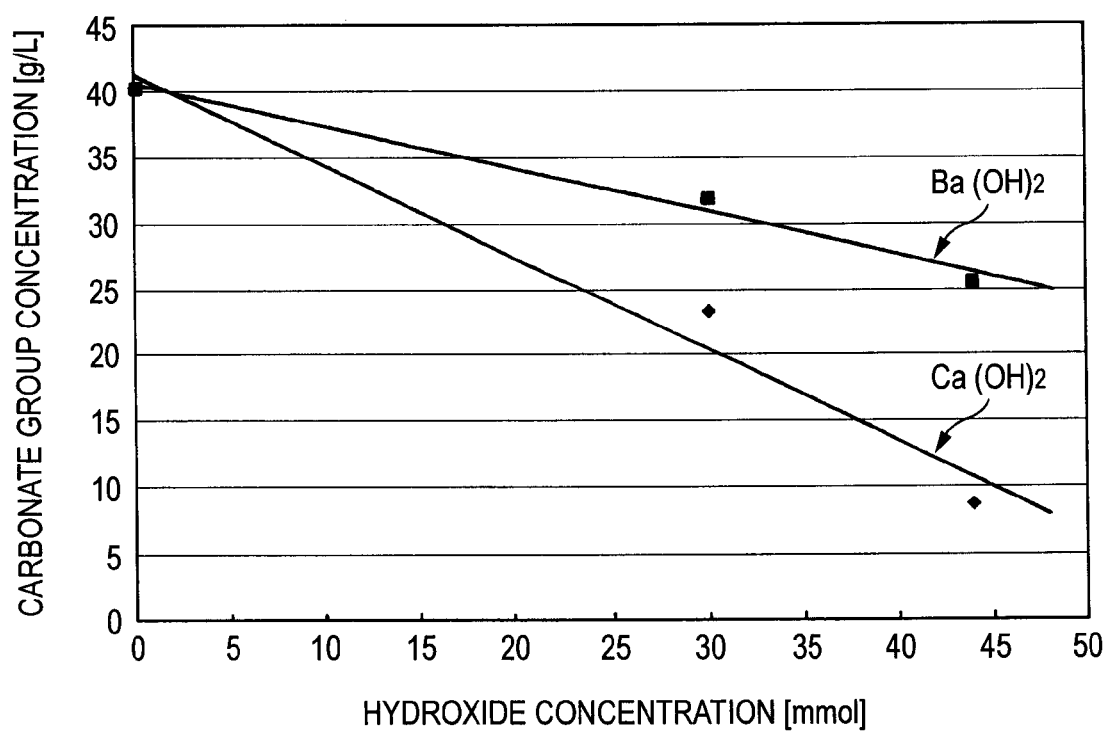
FIG. 2 is a diagram showing relationship between a hydroxide concentration and a carbonate group concentration.

In FIG. 2, relationship between an addition amount of a precipitating agent (concentration of hydroxide) and an amount of carbonate groups (concentration of carbonate group) is shown. From the viewpoint of environment and toxicity, it is considered desirable that calcium compounds that are generally used, more specifically, hydroxide compounds are preferably added to remove the carbonate groups in the alkaline permanganate etching solution.

Furthermore, as shown in the equation (3), in a method where a hydroxide is used to remove the carbonate groups, an alkali metal hydroxide necessary for the alkaline permanganate etching solution can be produced as a byproduct. Thereby, an amount of alkali that is added when the alkaline permanganate etching solution is regenerated can be reduced.

Besides, although calcium hydroxide is used for the processes in the above embodiments, in the present invention, alkaline earth hydroxide, alkaline earth halogenide or alkaline earth oxide etc. may be used.

Embodiments of the invention are described with reference to attached drawings. However, the invention, without restricting to the embodiments, can be variously shaped, modified or corrected within a range that does not deviate from a spirit and a range of the invention.

As mentioned above, according to the invention, in an etching process that uses an alkaline permanganate etching solution, an etching solution can be efficiently regenerated and as the result thereof the etching efficiency can be improved. Accordingly, the invention can be preferably applied to a desmear process or a roughening process of a resin that is used in wiring boards. That is, the invention can be conveniently made use of in a wide field such as resinous semiconductor packages, printed wiring boards, ceramics/resinous conductor (hybrid resin) substrates, interposers, car parts and decoration parts.

What is claimed is:

1. A process for regenerating an alkaline permanganate etching solution, comprising the steps of:
   contacting a used alkaline permanganate etching solution and an alkaline earth hydroxide together in a reaction chamber;
   agitating the used alkaline permanganate etching solution and the alkaline earth hydroxide in the reaction chamber;
   exhausting from a side portion or a top portion of the reaction chamber through a filter a liquid including a regenerated alkaline permanganate etching solution; and
   exhausting from a bottom portion of the reaction chamber a precipitate including a hardly soluble or insoluble matter that is incapable of passing through the filter.

2. The process according to claim 1, wherein
   the alkaline earth hydroxide is calcium hydroxide or barium hydroxide.

3. The process according to claim 1, wherein
   the hardly soluble or insoluble matter that is incapable of passing through the filter is partially scraped off by use of a squeegee door.

4. The process according to claim 1, further comprising the steps of:
   accommodating the liquid exhausted from the reaction chamber into a second reaction chamber;
   precipitating a hardly soluble or insoluble matter from the liquid in the second reaction chamber;
   exhausting the liquid in the second reaction chamber through a second filter from a side portion of the second reaction chamber; and
   exhausting from a bottom portion of the second reaction chamber a precipitate including a hardly soluble or insoluble matter that is incapable of passing through the second filter.

5. The regeneration process of an etching solution according to claim 4, wherein
   the hardly soluble or insoluble matter that is incapable of passing through the second filter is scraped off by use of a second squeegee door.

* * * * *